(12) United States Patent
Moon et al.

(10) Patent No.: US 7,535,027 B2
(45) Date of Patent: May 19, 2009

(54) AMORPHOUS-SILICON THIN FILM TRANSISTOR AND SHIFT RESISTER HAVING THE SAME

(75) Inventors: Seung-Hwan Moon, Yong-si (KR); Back-Won Lee, Seoul (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 240 days.

(21) Appl. No.: 11/056,259

(22) Filed: Feb. 14, 2005

(65) Prior Publication Data

US 2005/0145849 A1  Jul. 7, 2005

Related U.S. Application Data

(62) Division of application No. 10/607,151, filed on Jun. 27, 2003, now Pat. No. 6,906,385.

(30) Foreign Application Priority Data

Mar. 4, 2003  (KR) ............... 10-2003-0013363

(51) Int. Cl.
*H01L 27/15* (2006.01)
(52) U.S. Cl. .................... 257/84; 257/88; 257/184; 257/187; 257/257; 257/E27.1
(58) Field of Classification Search ............. 257/84, 257/88, 184, 187, 257
See application file for complete search history.

(56) References Cited

U.S. PATENT DOCUMENTS

| 5,656,824 A * | 8/1997 | den Boer et al. ............ 257/59 |
| 5,877,512 A | 3/1999 | Kim ......................... 257/57 |
| 6,274,884 B1 | 8/2001 | Lee et al. ................... 257/57 |
| 6,555,876 B2 * | 4/2003 | Jun et al. .................. 257/350 |
| 6,670,708 B2 | 12/2003 | Choo et al. ............... 257/739 |
| 6,774,396 B1 | 8/2004 | Chang et al. ............... 257/59 |
| 2002/0000557 A1 * | 1/2002 | Kido ........................ 257/66 |

* cited by examiner

*Primary Examiner*—Wai-Sing Louie
(74) *Attorney, Agent, or Firm*—Macpherson Kwok Chen & Heid LLP; Mark A. Pellegrini

(57) ABSTRACT

An amorphous-silicon thin film transistor and a shift register shift having the amorphous-silicon TFT include a first conductive region, a second conductive region and a third conductive region. The first conductive region is formed on a first plane spaced apart from a substrate by a first distance. The second conductive region is formed on a second plane spaced apart from the substrate by a second distance. The second conductive region includes a body conductive region and two hand conductive regions elongated from both ends of the body conductive region to form an LI-shape. The third conductive region is formed on the second plane. The third conductive region includes an elongated portion. The elongated portion is disposed between the two hand conductive regions of the second conductive region. The amorphous-silicon TFT and the shift register having the amorphous TFT reduce a parasitic capacitance between the gate electrode and drain electrode.

13 Claims, 11 Drawing Sheets

200

A-A'

205 210 215 220 225 245

B-B'

205 210 215 220 225 230 245

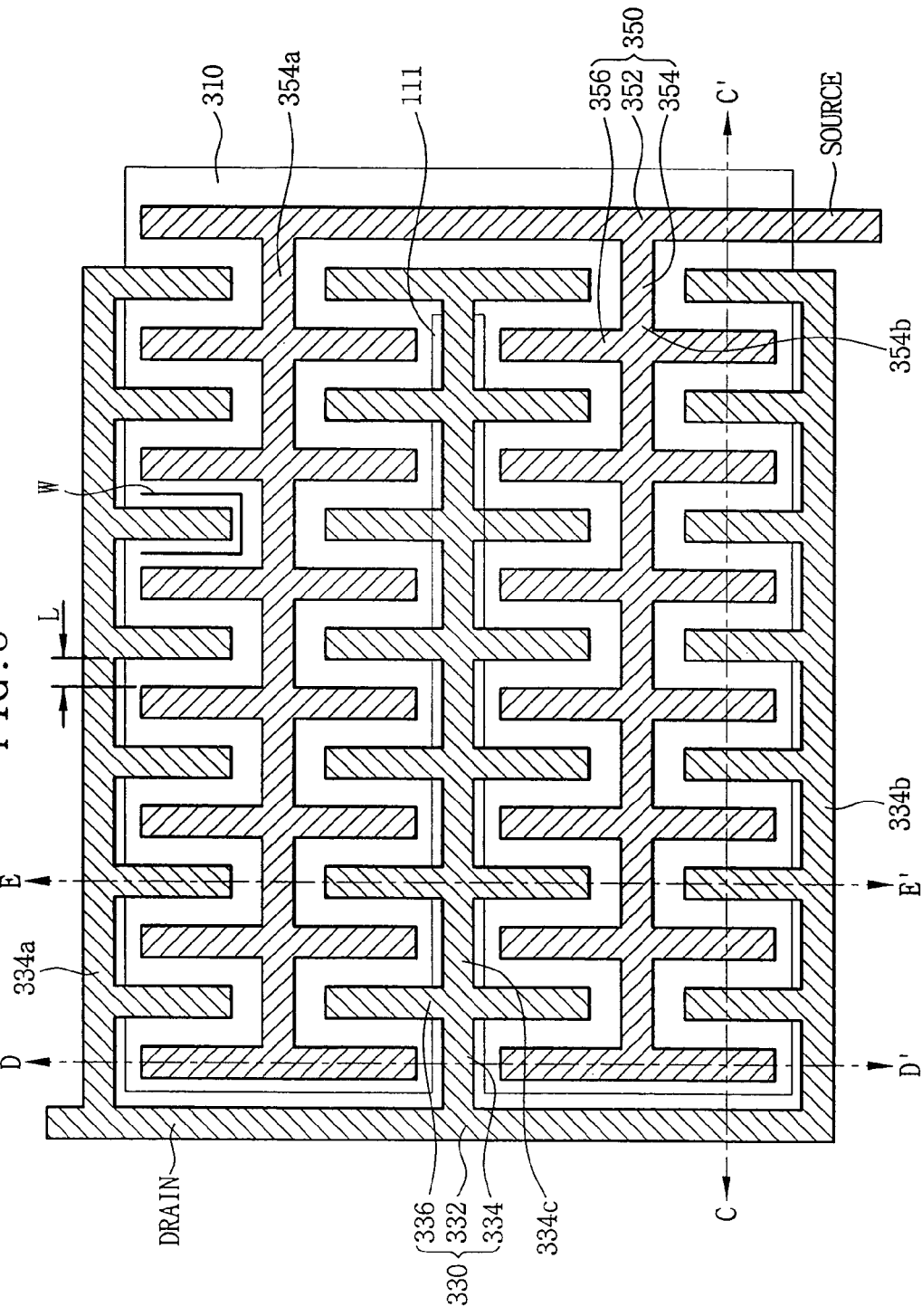

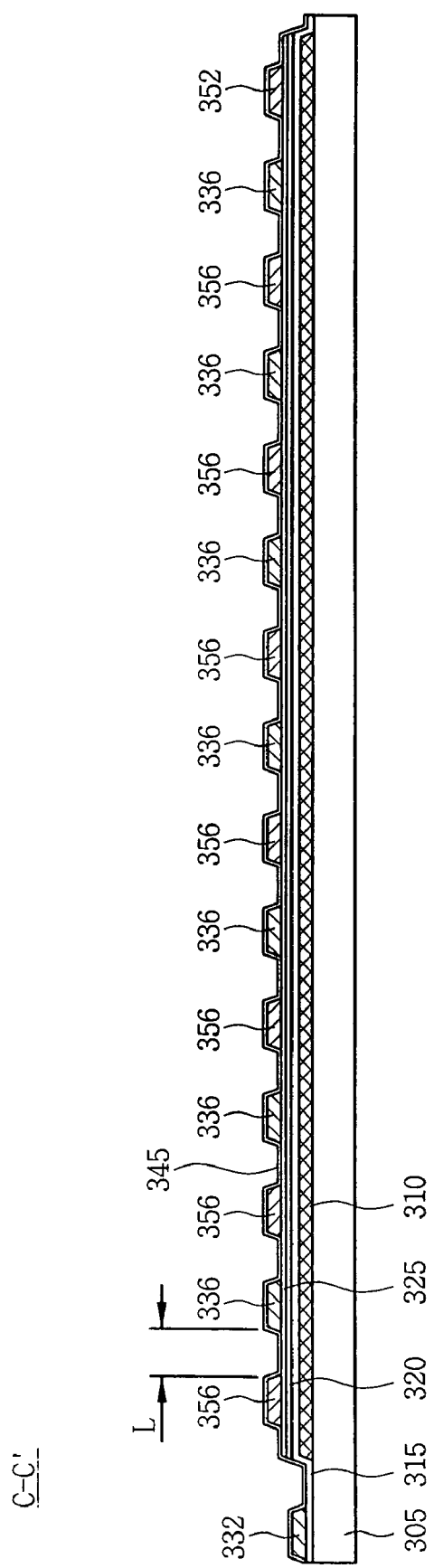

US 7,535,027 B2

AMORPHOUS-SILICON THIN FILM TRANSISTOR AND SHIFT RESISTER HAVING THE SAME

CROSS REFERENCE TO RELATED APPLICATION

This application relies for priority upon Korean Patent Application No. 2003-13363 filed on Mar. 4, 2003, the contents of which are herein incorporated by reference in its entirety.

This application is a divisional application of U.S. patent application Ser. No. 10/607,151, filed on Jun. 27, 2003, now U.S. Pat. No. 6,906,385, which claims the benefit of Korean Patent Application No. 10-2003-0013363, filed on Mar. 4, 2003, both of which are hereby incorporated by reference for all purposes as if fully set forth herein.

BACKGROUND OF THE INVENTION

1. Field of the Invention

The present invention relates to an amorphous silicon thin film transistor and a shift register having the amorphous-silicon thin film transistor, and more particularly to an amorphous-silicon thin film transistor having reduced parasitic capacitance and a shift register having the amorphous-silicon thin film transistor.

2. Description of the Related Art

A liquid crystal display device is equipped with a gate driver integrated circuit (IC). The gate driver integrated circuit is mounted on a liquid crystal display panel as a tape carrier package (TCP) or via a chip-on-glass (COG) manner. However, the liquid crystal display device equipped with the gate driver integrated circuit has some disadvantages such as high manufacturing cost and a structural hindrance for designing the liquid crystal display device. Thus, a liquid crystal display device having no gate driver integrated circuit has been developed. The gate driver integrated circuit may be embodied using the process of manufacturing amorphous-silicon thin film transistor.

One example of a shift register circuit including amorphous-silicon thin film transistors is disclosed in U.S. Pat. No. 5,517,542. The shift register circuit disclosed in the U.S. patent includes seven amorphous-silicon thin film transistors.

FIG. 1 is a circuit diagram showing a stage of a conventional shift register. The stage of the conventional shift register is disclosed in the above U.S. patent. The conventional shift register replaces the gate driver integrated circuit.

Referring to FIG. 1, each of the stages of the shift register includes a pull-up part 110, a pull-down part 120, a pull-up driver part 130 and a pull-down driver part 140. The shift register receives a gate line driving signal GOUTN-1 of a previous stage (or scan start signal STY, when the stage is a first stage), and the shift register generates a gate line driving signal GOUTN (or scan signal). When a stage is a first stage of the shift register, the first stage receives the scan start signal STY generated from a timing controller (not shown), and generates a first gate line driving signal GOUTL' When the stage is a second stage of the shift register, the second stage receives the first gate line driving signal GOUT1 generated from the first stage, and generates a second gate line driving signal GOUT2. Likewise, when the stage is an Nth stage, the stage receives a (N-1)th gate line driving signal GOUTN_1 generated from a (N-1)th stage, and generates a Nth gate line driving signal GOUTN.

The shift registers are integrated in a thin film transistor liquid crystal display panel so as to perform the same operation of the gate driver integrated circuit.

The shift resisters are integrated in a thin film transistor liquid crystal display panel so as to perform the same operation of the gate driver integrated circuit.

FIG. 2 is a block diagram showing a gate driver circuit including a state of FIG. 1.

Referring to FIGS. 1 and 2, a gate driver circuit 174 generates gate line driving signals $GOUT_1$, $GOUT_2$, ..., $GOUT_N$. The gate driver circuit 174 includes N stages.

A first stage SRC1 receives a scan start signal STV generated from the timing controller (not shown), a gate turn-on voltage VON, a gate turn-off voltage VOFF and a first power clock signal CKV. The first stage SRC1 generates a first gate line driving signal $GOUT_1$ for selecting a first gate line.

A second stage SRC2 receives the first gate line driving signal $GOUT_1$ generated from the first stage SRC1, the gate turn-on voltage VON, the gate turn-off voltage VOFF, and a second power clock signal CKVB. The second stage SRC2 generates a second gate line driving signal $GOUT_2$ for selecting a second gate line.

Likewise, an Nth stage SRCN receives a (N-1)th gate line driving signal $GOUT_{N-1}$ generated form the (N-1)th stage, the gate turn-on voltage VON, the gate turn-off voltage VOFF and the first power clock signal CKV or the second power clock signal CKVB. The Nth stage SRCN generates an Nth gate line driving signal $GOUT_N$ for selecting an Nth gate line.

FIG. 3A is a logic diagram showing a stage of a shift register of FIG. 1, FIG. 3B is a timing diagram showing an operation of a stage, and FIG. 3C is a partial circuit diagram showing a virtual parasitic capacitor electrically coupled to a pull-up transistor of FIG. 1.

Referring to FIG. 3A, an unit stage may be expressed as the equivalent circuit including a S/R latch 21 and an AND-gate 22. A timing diagram of FIG. 3B shows an operation of the unit stage.

The S/R latch 21 may be embodied in various forms. A pull-down transistor, which outputs a clock signal CK1 in response to an output value Q generated from the S/R latch 21, is essential.

Referring again to FIG. 1, an NMOS transistor Q1 of the pull-up part 110 includes an amorphous-silicon. Therefore, the NMOS transistor Q1 of the pull-up part 110 has very large transistor size because a large amplitude of voltage (for example, from -14V to 20V) should be applied to the NMOS transistor Q1 due to the very small electron mobility of the amorphous-silicon of the NMOS transistor Q1 so as to drive the liquid crystal display device having a large screen size. For example, in liquid crystal display panel having a screen size of 12.1 inch (XGA), a parasitic capacitance of a gate line has a value from about 250 pF to about 300 pF. Therefore, in order to drive an amorphous-silicon thin film transistor designed in accordance with minimum design rule 4 µm, a channel width of the amorphous-silicon thin film transistor should be about 5500 µm when a channel length of the amorphous-silicon thin film transistor is about 4 µm.

Therefore, a parasitic capacitance Cgd between a gate electrode and a drain electrode of the NMOS amorphous-silicon thin film transistor Q1 increases. The value of the parasitic capacitance is about 3 pF. This value causes a mal-function of the gate driver circuit employing the NMOS amorphous-silicon thin film transistor.

The reason of the mal-function is as follows. The parasitic capacitor Cgd is electrically connected with a terminal to which a clock signal CK1 (the first power clock signal CKV or the second power clock signal CKVB) having a large amplitude of voltage (for example, from about −14V to about 20V) is applied, and the parasitic capacitor Cgd is electrically connected between the drain and gate electrodes of the NMOS amorphous-silicon thin film transistor Q1 to apply undesired voltage signal to the gate electrode of the NMOS amorphous-silicon thin film transistor Q1. For example, when there exists no holding transistor for maintaining the voltage level of the gate electrode of the NMOS amorphous-silicon thin film transistor Q1 at the gate turn-off voltage VOFF, the power clock signal (CKV or CKVB) is applied to the gate electrode of the NMOS amorphous-silicon thin film transistor Q1. Therefore, a voltage of the gate electrode is from about −14V to about 20V, an output signal equals to 20−Vth(V) (maximum value minus threshold voltage of the NMOS amorphous-silicon transistor), and the output signal is applied to the gate line of the liquid crystal display panel. Therefore, abnormal image display may occur.

In order to maintain the voltage level of the gate electrode of the pull-up transistor Q1 (NMOS amorphous-silicon thin film transistor) at the gate turn-off voltage state VOFF, a hold transistor Q5 is essential. The hold transistor Q5 is an amorphous-silicon thin film transistor. A pull-down thin film transistor Q2 performs a pull down function where the scan signal is maintained at gate turn-off voltage VOFF in most of the period after the pull-up transistor Q1 operates.

The parasitic capacitor Cgd has large capacitance and is electrically coupled to the terminal to which the clock pulse CK (from about −14V to about 20V). Therefore, in order to maintain a gate electrode of the pull-up transistor Q1 or the pull-down transistor Q2 at a lower voltage than the threshold voltage Vth of the pull-up transistor Q1 or the pull-down transistor Q2, the hold transistor Q5 should have a large transistor size. Hereinafter, a transistor size is referred to as the ratio (W/L) of a channel width (W) of the transistor with respect to a channel length (L) of the transistor.

It is hard to form the hold transistor Q5 having a large transistor size in a region of narrow black matrix or in a region of seal-line. Further, when the hold transistor Q5 is deteriorated, a display quality of a liquid crystal display device may be lowered.

SUMMARY OF THE INVENTION

Accordingly, the present invention is provided to substantially obviate one or more problems due to limitations and disadvantages of the related art.

In one aspect of the present invention, there is provided an amorphous-silicon thin film transistor having reduced parasitic capacitance that causes a mal-function.

In another aspect of the present invention, there is provided a shift register including the amorphous-silicon thin film transistor.

The amorphous-silicon thin film transistor according to one embodiment of the present invention includes a first conductive region, a second conductive region and a third conductive region. The first conductive region is formed on a first plan that is spaced apart from a substrate by a first distance. The second conductive region is formed on a second plane that is spaced apart from the substrate by a second distance. The second conductive region includes a body conductive region and two hand conductive regions elongated from both ends of the body conductive region to form an U-shape. The third conductive region is formed on the second plane. The third conductive region includes an elongated portion. The elongated portion is disposed between the two hand conductive regions of the second conductive region.

The amorphous-silicon thin film transistor according to another embodiment of the present invention includes a first conductive region, a second conductive region and a third conductive region. The first conductive region is formed on a first plane that is spaced apart from a substrate by a first distance. The second conductive region is formed on a second plane that is spaced apart from the substrate by a second distance. The second conductive region includes a second body conductive region and a plurality of second hand conductive regions. The second body conductive region is extended in a first direction, and the second hand conductive regions are elongated from the second body conductive region in a second direction. The third conductive region is formed on the second plane. The third conductive region includes a third body conductive region and a plurality of third hand conductive regions. The third body conductive region is extended in the first direction to face the second body conductive region. The third hand conductive regions are elongated from the third body conductive region toward the second body conductive region. Each of the third hand conductive regions is disposed between the second hand conductive regions.

The shift register according to further another embodiment of the present invention includes a plurality of cascade-connected stages. A first stage receives a scan start signal. Each of the stages sequentially generates an output signal. Odd number of stages receives a first clock signal and a first control signal for discharging the first clock signal charged in a present stage in response to an output signal of a next stage. Even number of stages receives a second clock signal having a 1800 phase difference with respect to the first clock signal and a second control signal for discharging the second clock signal charged in the present stage in response to the output signal of the next stage. Each of the stages includes a pull-up part, a pull-down part, a pull-up driving part and a pull-down driving part. The pull-up part provides an output terminal with the first clock or the second clock. The pull-up device includes i) a first conductive region formed on a first plane that is spaced apart from a substrate by a first distance, ii) a second conductive region formed on a second plane that is spaced apart from the substrate by a second distance, the second conductive region including a second body conductive region and a plurality of second hand conductive regions, the second body conductive region extended in a first direction, and the second hand conductive regions elongated from the second body conductive region In a second direction, iii) a third conductive region formed on the second plane, the third conductive region including a third body conductive region and a plurality of third hand conductive regions, the third body conductive region extended in the first direction to face the second body conductive region, the third hand conductive regions elongated from the third body conductive region toward the second body conductive region, and each of the third hand conductive regions disposed between the second hand conductive regions. The pull-down part provides the output terminal with a first power voltage. The pull-up driving part is electrically coupled with a first input node of the pull-up part. The pull-up driving part turns on the pull-up part in response to a first leading edge of the output signal of a previous stage. The pull-up driving part turns off the pull-up device in response to a second leading edge of the first control signal or the second control signal. The pull-down driving part is electrically coupled with a second input node of the pull-down part. The pull-down driving part turns off the pull-down part in response to a third leading edge of an Input signal that is inputted to an input terminal of each of the stages. The pull-down driving part turns on the pull-down part In response to the second leading edge of the first control signal or the second control signal.

The shift register according to further another embodiment of the present invention includes a plurality of cascade-connected stages. A first stage receives a scan start signal. Each of the stages sequentially generates an output signal. Odd number of stages receives a first clock signal and a first control signal for discharging the first clock signal charged in a present stage in response to an output signal of a next stage. Even number of stages receives a second clock signal having a 1800 phase difference with respect to the first clock signal and a second control signal for discharging the second clock signal charged in the present stage in response to the output signal of the next stage. Each of the stages includes a pull-up transistor, a pull-down transistor, a pull-up driving part and a pull-down driving part. The pull-up transistor provides an output terminal with the first clock signal or the second clock signal. The pull-up transistor includes a first conductive region, a second conductive region and a third conductive region. The first conductive region is formed on a first plane that is spaced apart from a substrate by a first distance. The second conductive region is formed on a second plane that is spaced apart from the substrate by a second distance. The second conductive region includes a second body conductive region and a plurality of second hand conductive regions. The second body conductive region is extended in a first direction. The second hand conductive regions are elongated from the second body conductive region in a second direction. The third conductive region is formed on the second plane. The third conductive region includes a third body conductive region and a plurality of third hand conductive regions. The third body conductive region is extended in the first direction to face the second body conductive region. The third hand conductive regions are elongated from the third body conductive region toward the second body conductive region. Each of the third hand conductive regions is disposed between the second hand conductive regions. The pull-down transistor provides the output terminal with a first power voltage. The pull-up driving part is electrically coupled with a first input node of the pull-up part. The pull-up driving part turns on the pull-up transistor in response to a first leading edge of the output signal of a previous stage. The pull-up driving part turns off the pull-up transistor in response to a second leading edge of the first control signal or the second control signal. The pull-down driving part is electrically coupled with a second input node of the pull-down transistor. The pull-down driving part turns off the pull-down transistor in response to a third leading edge of an input signal that is inputted to an input terminal of each of the stages. The pull-down driving part turns on the pull-down transistor in response to the second leading edge of the first control signal or the second control signal.

The shift register according to further another embodiment of the present invention drives a liquid crystal display device. The shift register turns on or turns off a plurality of gate lines electrically coupled to a plurality of thin film transistors arranged in a matrix shape on a liquid crystal display panel. The shift register includes a first conductive region, a second conductive region and the third conductive region. The first conductive region is formed on a first plane that is spaced apart from a substrate by a first distance. The second conductive region is formed on a second plane that is spaced apart from the substrate by a second distance. The second conductive region includes a body conductive region and two hand conductive regions elongated from both ends of the body conductive region to form an If-shape. The third conductive region is formed on the second plane. The third conductive region includes an elongated portion. The elongated portion is disposed between the two hand conductive regions of the second conductive region.

The amorphous-thin film transistor and the shift register having the amorphous thin film transistor have a reduced parasitic capacitance between the gate electrode (or first conductive region) and drain electrode (or a third conductive region).

BRIEF DESCRIPTION OF THE DRAWINGS

The above and other features and advantages of the present invention will become more apparent by describing in detail the preferred embodiments thereof with reference to the accompanying drawings, in which:

FIG. 6 is a layout showing an amorphous-silicon thin film transistor according to a second exemplary embodiment of the present invention;

FIG. 7A is a cross-sectional view taken along the line C-C' of FIG. 6;

DESCRIPTION OF PREFERRED EMBODIMENTS

Hereinafter the preferred embodiment of the present invention will be described in detail with reference to the accompanying drawings.

Figure 1:
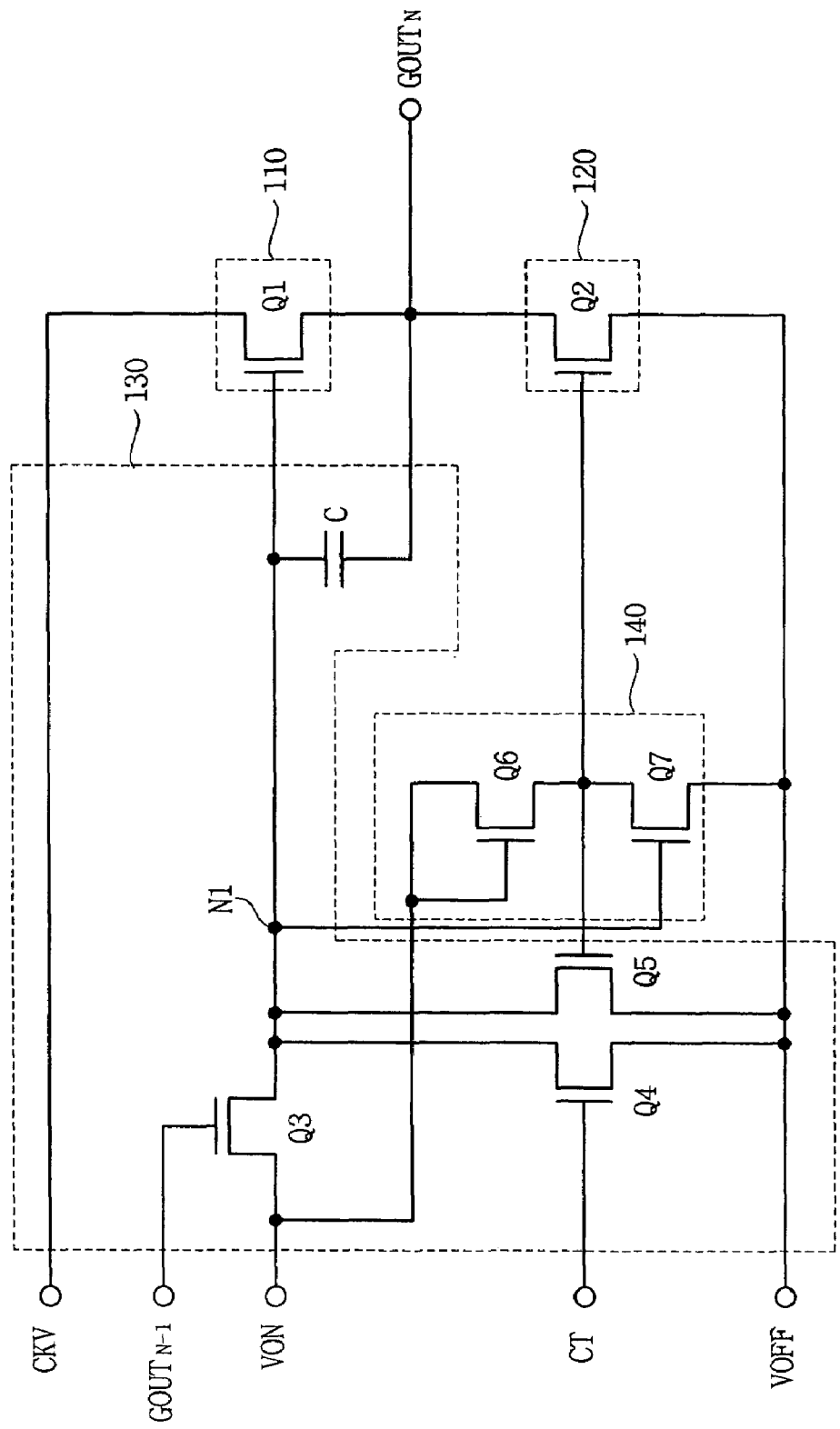
FIG. 1 is a circuit diagram showing a stage of a conventional shift register.
Figure 2:
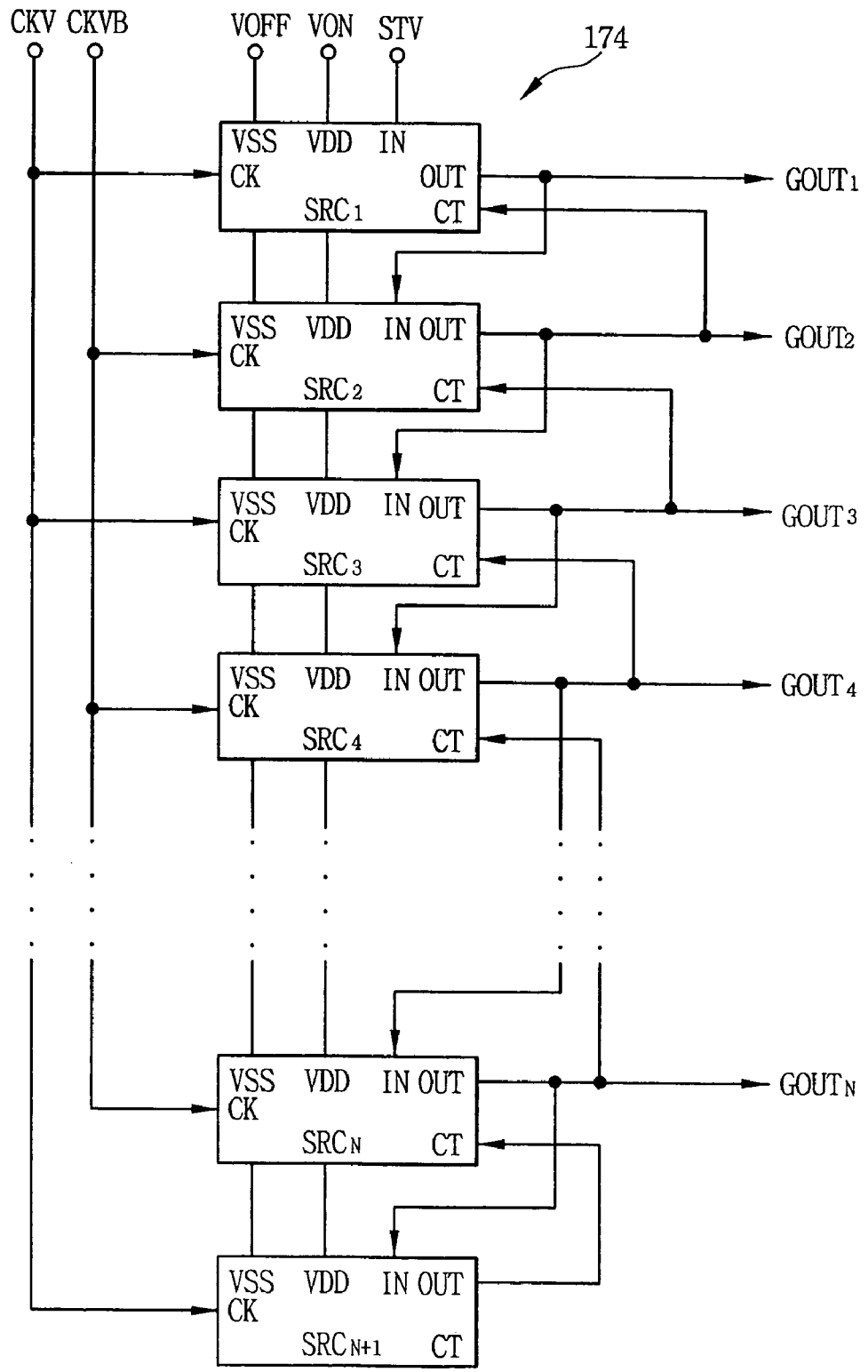
FIG. 2 is a block diagram showing the shift register of FIG. 1.
Figure 3A:
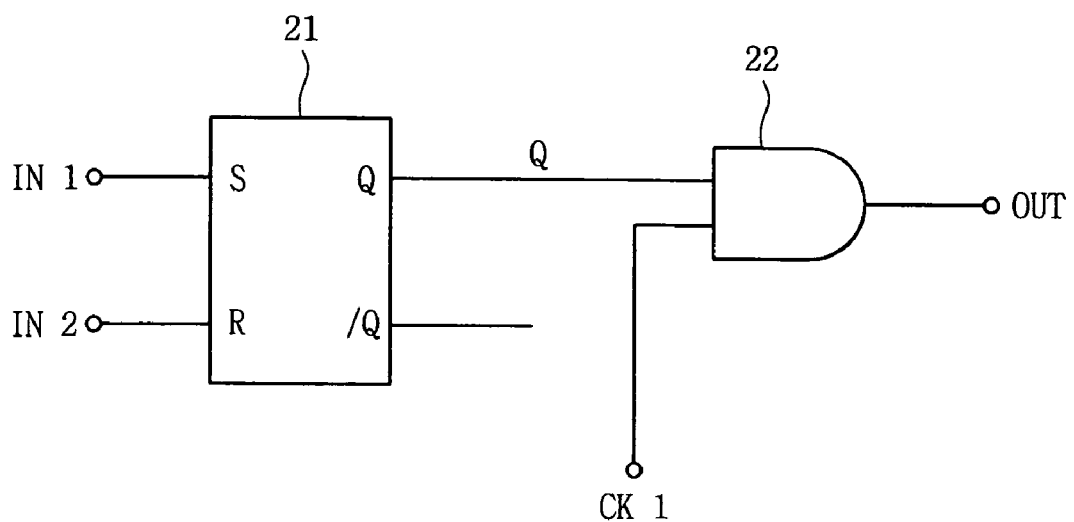
FIG. 3A is an equivalent logic circuit showing an unit stage of the shift register of FIG. 1.
Figure 3B:
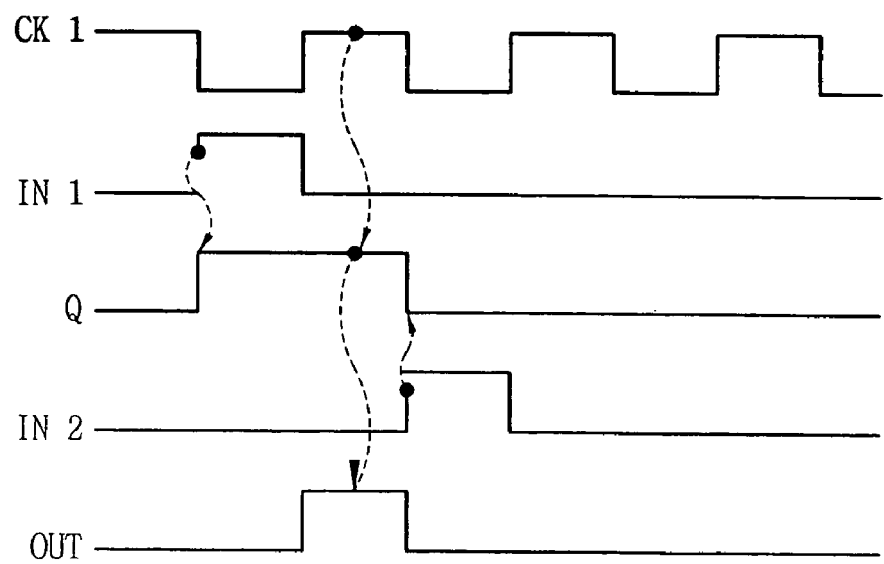
FIG. 3B is a timing diagram showing an operation of a stage of the shift register of FIG. 1.
Figure 3C:
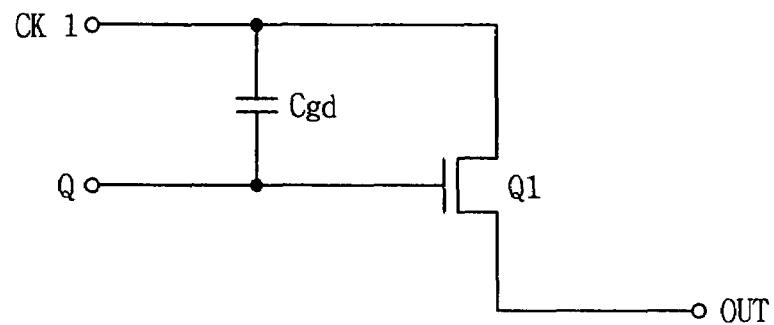
FIG. 3C is an equivalent circuit diagram showing a parasitic capacitor existing in a pull-up transistor of FIG. 1.
Figure 4:
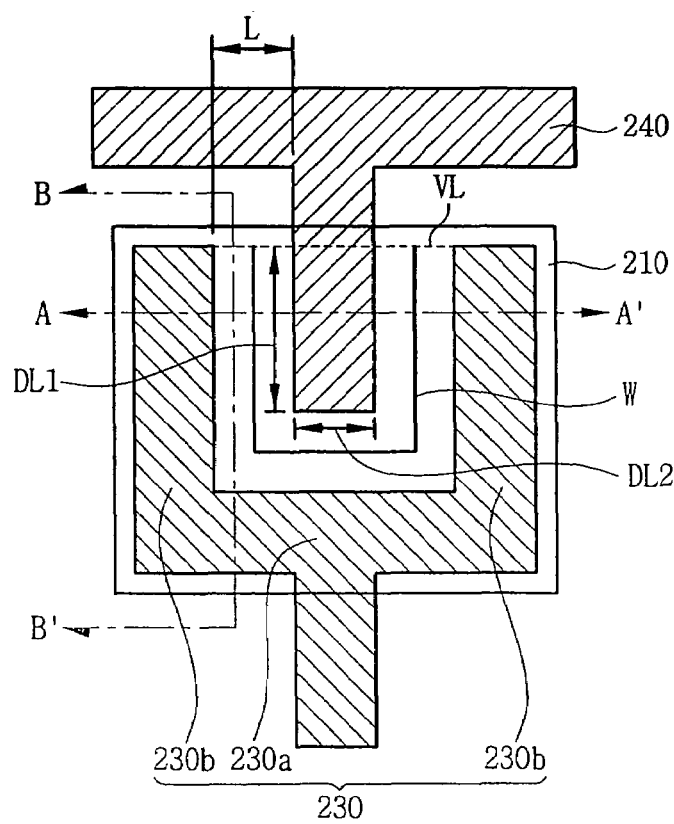
FIG. 4 is a layout showing an amorphous-silicon thin film transistor according to a first exemplary embodiment of the present invention.

FIG. 4 is a layout showing an amorphous-silicon thin film transistor according to a first exemplary embodiment of the present invention. The amorphous-silicon thin film transistor according to the first exemplary embodiment of the present invention has reduced parasitic capacitance.

Referring to FIG. 4, a first conductive region 210 occupies some region of a substrate (not shown). A second conductive region 230 is disposed over the first conductive region 210. The second conductive region 230 includes a body conductive region 230a and two hand conductive region 230b elongated from the both end of the body elongated line 230a to form an U-shape. A dotted line VL connects both distal ends of the hand conductive regions 230. A third conductive region

240 may have an I-shape. The third conductive region 240 is disposed over the first conductive region 210. A portion of the third conductive region 240 is disposed in an internal region defined by the second conductive region 230 and the dotted line VL. The third conductive region 240 is substantially perpendicular to the dotted line VL.

The first conductive region 210 corresponds a gate electrode of the amorphous-silicon thin film transistor. The second conductive region 230 may correspond to a drain electrode or a source electrode of the amorphous-silicon thin film transistor. The third conductive region 240 may also correspond to the drain electrode or the source electrode of the amorphous-silicon thin film transistor. When one of the second conductive region 230 and the third conductive region 240 corresponds to the drain electrode, the other corresponds to the source electrode. For example, the third conductive region 240 corresponds to a drain electrode so as to reduce the parasitic capacitance between the gate electrode and the drain electrode of the amorphous-silicon thin film transistor because the area where the third conductive region 240 overlaps the gate electrode 210 is less than the area where the second conductive region 230 overlaps the gate electrode 210.

Hereinafter, the first conductive region 210 is referred to as a gate electrode of the amorphous-silicon thin film transistor. The second conductive region 230 is referred to as a source electrode of the amorphous-silicon thin film transistor. The third conductive region 240 is referred to as a drain electrode of the amorphous-silicon thin film transistor.

Preferably, the U-shape source electrode 230 may have a protruding portion and may have an Y-shape. The drain electrode 240 having an I-shape may further include another I-shaped portion disposed outside of the gate electrode 210, so that the drain electrode 240 may have a T-shape.

The amorphous silicon thin film transistor 200 receives an external voltage through an external electrode line (not shown), which is electrically connected with the drain electrode 240, and the amorphous silicon thin film transistor 200 outputs an external voltage through an external electrode line (not shown) electrically connected with the source electrode 230.

The drain electrode 240 includes a horizontal portion and a vertical portion elongated from the horizontal portion to form a T-shape. A portion of the vertical portion of the drain electrode 240 faces the gate electrode 210 and is inserted into the U-shaped inner portion of the source electrode 230. A channel is formed between the inserted vertical portion of the drain electrode 240 and the U-shaped inner portion of the source electrode 230. In detail, the channel is formed between the vertical portion of the drain electrode 240 and the U-shaped inner portion of the source electrode 230. A ratio of a longitudinal length DL1 of the channel with respect to a width DL2 of the vertical portion is related to the parasitic capacitance between the gate electrode and the drain electrode. For example, when the longitudinal length DL1 of the channel is about five times larger than the width DL2 of the vertical portion of the drain electrode 240, the parasitic capacitance between the gate electrode 230 and the drain electrode 240 is about 9.1% reduced, in comparison with the conventional amorphous thin film transistor. When the longitudinal length DL1 of the channel is substantially equal to the width DL2 of the vertical portion of the source electrode 240, the parasitic capacitance between the gate electrode 230 and the drain electrode 240 is about 33% reduced. A channel width W of the amorphous-silicon transistor is an average width of the channel. A channel length L is a distance between the drain electrode 230 and the source electrode 240.

Amorphous-silicon has low electron mobility. Therefore, in order to allow enough current to flow between the drain electrode and the source electrode, the ratio of the channel width W to the channel length L is preferably increased. However, according to design rule, since there exists a minimum limitation for increasing the channel length L, the channel width W is preferably increased. When the channel width increases, the area of the region of the drain electrode 240, which overlaps the gate electrode 210, increases. When the T-shaped electrode is a drain electrode, only a portion of the vertical portion of the drain electrode overlaps the gate electrode 210. Therefore, the parasitic capacitance between the gate electrode and the drain electrode becomes smaller compared with the conventional configuration of the gate electrode and the drain electrode.

Hereinafter, a method of manufacturing the amorphous thin film transistor having the structure above mentioned is described in detail.

Figure 5A:
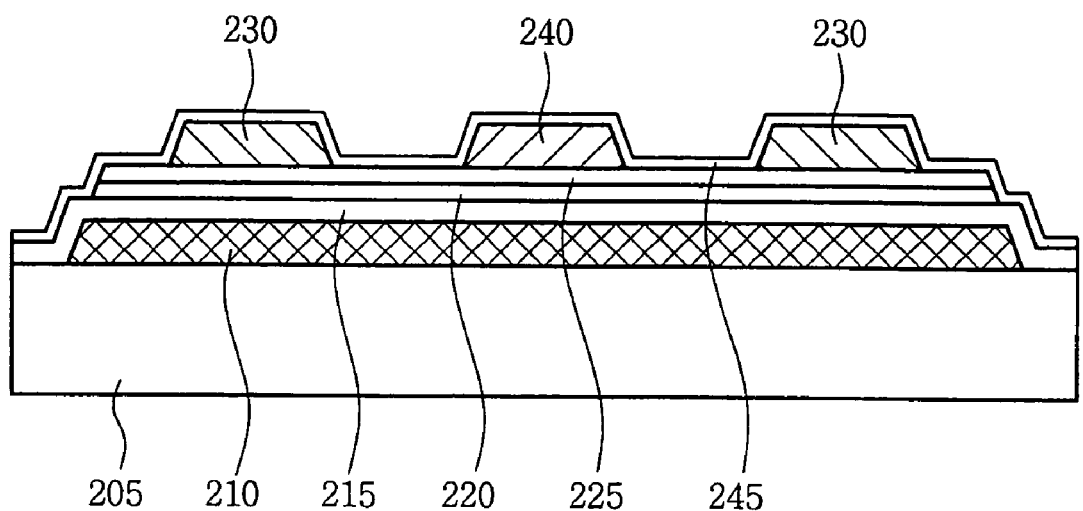
FIG. 5A is a cross-sectional view taken along the line A-A' of FIG. 4.
Figure 5B:
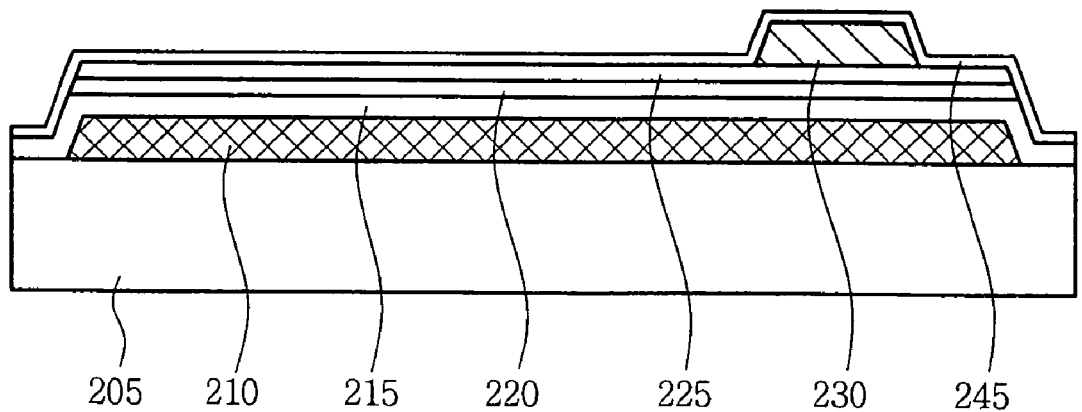
FIG. 5B is a cross-sectional view taken along the line B-B' of FIG. 4.

FIG. 5A is a cross-sectional view taken along the line A-A' of FIG. 4 and FIG. 5B is a cross-sectional view taken along the line B-B' of FIG. 4.

Referring to FIGS. 5A and 5B, a metal layer including aluminum is deposited on a transparent substrate 205. The metal layer is patterned to thereby form a gate electrode 210. In FIGS. 5A and 5B, the gate electrode 210 includes only one layer. However, other metal, such as chrome (Cr) or molybdenum (Mo) may be further deposited on the aluminum (Al), so that the gate electrode may have multi-layered structure.

Then, an insulation layer, such as silicon oxide or silicon nitride is deposited on the transparent substrate 205 on which the gate electrode 210 is formed. An intrinsic semiconductor substance is deposited on the gate electrode 210 and a semiconductor substance having an impurity is deposited on the intrinsic semiconductor substance.

Then, the insulation layer, the intrinsic semiconductor substance and the impurity semiconductor substance are etched away, so that a gate insulation layer 215, an intrinsic semiconductor layer 220 and an impurity insulation layer 225 are formed.

The gate insulation layer 215 covers an entire surface of the gate electrode 210. The intrinsic semiconductor layer 220 is formed on a region of the insulation layer 215, disposed over the gate electrode 210. The impurity insulation layer 225 is formed on the intrinsic semiconductor layer 220.

Then, a metal, such as chrome (Cr) or alloy of chrome is deposited on the impurity insulation semiconductor layer 225. The metal is patterned and a source electrode 230 having If-shape (or Y-shape) and a drain electrode 240 having I-shape (or T-shape) are formed over the gate electrode 210. As shown in FIG. 4, the source electrode 230 is formed around the protruding portion of the drain electrode 240.

A portion of the impurity semiconductor layer 225 disposed between the source electrode 230 and the drain electrode 240 is eliminated completely through an etching step. A protection layer 245 is deposited on the entire surface of the transparent substrate 205 on which the source electrode 230 and the drain electrode 240 are formed. The protection layer 245 includes insulating materials, such as silicon oxide and silicon nitride.

In FIGS. 5A and 5B, the gate electrode 210 is formed on the transparent substrate 205 and the source electrode 230 and the drain electrode 240 are formed over the gate electrode 210. This type of thin film transistor is referred to as an inverted staggered type. The structure of the first exemplary embodiment of the present invention may be also applied to a staggered type. In the staggered type thin film transistor, a drain electrode and a source electrode is formed on the transparent substrate, and a gate electrode is formed over the drain electrode and the source electrode. The staggered type thin film transistor is not shown.

A structure of the amorphous-silicon transistor, which has an increased channel width W and reduced parasitic capacitance, is disclosed in FIG. 6. For convenience, only the pull-up transistor is explained. The amorphous-silicon transistor of FIG. 6 may be employed in a pull-up transistor having a large transistor size. The pull-up transistor is used in the gate driver circuit of a liquid crystal display device having a large screen size.

FIG. 6 Is a layout showing an amorphous-silicon thin film transistor according to a second exemplary embodiment of the present invention. For example, the amorphous silicon transistor of the second exemplary embodiment may be used as a pull-up transistor of a shift register of a liquid crystal display device having no gate driver integrated circuit. For convenience, a gate insulation layer, an intrinsic semiconductor layer and an impurity insulation layer formed over the substrate is omitted.

Referring to FIG. 6, the amorphous-silicon transistor of the second exemplary embodiment includes a gate electrode 310, a drain electrode 330 and a source electrode 350.

The gate electrode 310 is formed on a substrate (not shown). The gate electrode having a rectangular shape has an opening 111.

The drain electrode 330 includes a body drain electrode line (or a third body conductive region) 332, a hand drain electrode line (or a third hand conductive region) 334 and a finger drain electrode line (or a third finger conductive region) 336. The body drain electrode line 332 is formed near a circumference of the gate electrode 310 and is extended in a first direction.

The hand drain electrode line 334 includes a first hand drain electrode line 334a, a second hand drain electrode line 334b and a third hand drain electrode line 334c.

The first hand drain electrode line 334a is elongated from a first end of the body drain electrode line 332 in a second direction substantially perpendicular to the first direction, and the second hand drain electrode line 334b is elongated from a second end of the body drain electrode line 332 in the second direction, so that the body drain electrode line 332, the first hand drain electrode line 334a and the second hand drain electrode line 334b form an U-shape. The third hand drain electrode line 334c is extended in the second direction to be disposed between the first hand drain electrode line 334a and the second hand drain electrode line 334b.

The first hand drain electrode line 334a and the second hand drain electrode line 334b deviate from the gate electrode 310. The third hand drain electrode line 334c is disposed over the opening 111 of the gate electrode 310. Since the first hand drain electrode line 334a, the second hand drain electrode line 334b and the third hand drain electrode line 334c do not overlap with the gate electrode 310, the area of the region where the drain electrode 330 overlaps the gate electrode 310 is minimized. Therefore, a parasitic capacitance between the gate electrode 310 and the drain electrode 330 is minimized.

The finger drain electrode line 336 is protruded from the first hand conductive region 334a, the second hand conductive region 334b and the third hand conductive region 334c. The finger drain electrode line 336 is protruded from the first hand conductive region 334a toward the third hand conductive region 334c to face the finger drain electrode line protruding from the third hand conductive region 334c. The finger drain electrode line 336 is protruded from the second hand conductive region 334b toward the third hand conductive region 334c to face the finger drain electrode line protruding from the third hand conductive region 334c.

The source electrode 350 includes a body source electrode line (or a second body conductive region) 352, a hand source electrode line (a second hand source electrode line) 354 and a finger source electrode line (a second finger conductive region) 356.

The body source electrode line 352 is disposed over the gate electrode 310 so that the body source electrode line 352 overlaps the gate electrode 310. The body source electrode line 352 is extended in the first direction to face the body drain electrode 332. The hand source electrode line 354 is protruded from the body source electrode line 352 toward the body drain electrode line 332. The hand source electrode line 354 includes a first hand source electrode line 354a and a second hand source electrode line 354b. The first hand source electrode line 354a is disposed between the first hand drain electrode line 334a and the third hand drain electrode line 334c. The second hand source electrode line 354b is disposed between the third hand drain electrode line 334c and the second hand drain electrode line 334b. Therefore, each of the hand source electrode lines disposed between the hand drain electrode lines.

The finger source electrode line 356 is protruded from the first hand source electrode line 354a and the second hand source electrode line 354b. The finger source electrode line 356 is disposed between the finger drain electrodes 336. Therefore, each of the finger source electrodes 356 is disposed between the finger drain electrodes 336.

A channel length L of the amorphous-silicon thin film transistor is referred to as a distance between the finger drain electrode line 336 and the finger source electrode line 356 adjacent to the finger drain electrode line 336. A channel width W of the amorphous-silicon thin film transistor is referred to as an average length of the U-shape formed by the finger drain electrode line 336 and the finger source electrode line 356.

The above amorphous-silicon thin film transistor is employed in the pull-up transistor having a large transistor size, which is used in a gate driver circuit of a liquid crystal display device having no gate driver integrated circuit. However, the above amorphous-silicon thin film transistor may be employed in a pull-down transistor or a hold transistor having a large transistor size, which is used in a gate driver circuit of the liquid crystal display device having no gate driver integrated circuit.

When n finger drain electrode lines 336 or n finger source electrode lines 356 are formed so as to form the amorphous-silicon thin film transistor having a large size, n×4 μm channel width may be formed without increasing the parasitic capacitance between the gate and drain electrodes. In detail, when a channel width of the finger drain electrode line 336 or the finger source electrode line 356 is 4 μm according to a minimum design rule, an 3 edges of the finger drain electrode line 336 and an inner portion of the U-shape finger source electrode line 356 forms a channel, so that 3×4 μm channel width is formed. Therefore, 2×4 μm channel width is additionally obtained without increasing the parasitic capacitance between the drain and gate electrodes.

Further, when the amorphous-silicon thin film transistor having a large size is used in the shift register, and the shift register is used in the gate driver circuit of the liquid crystal display device having no gate driver integrated circuit, the parasitic capacitance of the parasitic capacitor electrically coupled to a clock signal CK1 or CK2 is reduced. Therefore, the malfunction of the hold transistor caused by deterioration is reduced, so that the reliability of the liquid crystal display device is increased.

Hereinafter, a method of manufacturing an amorphous-silicon thin film transistor according to a second exemplary embodiment of the present invention is explained referring to FIGS. 7A to 7C.

Figure 7B:
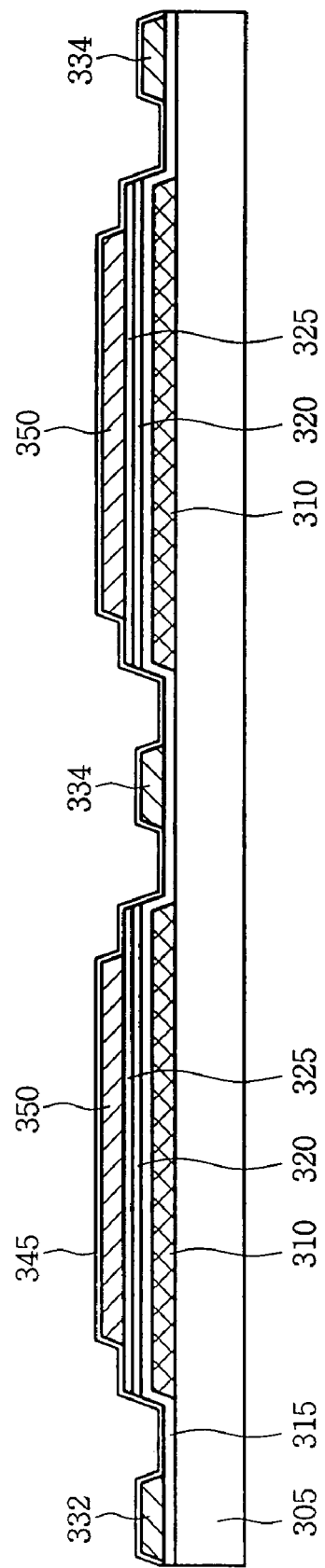
FIG. 7B is a cross-sectional view taken along the line D-D' of FIG. 6.
Figure 7C:
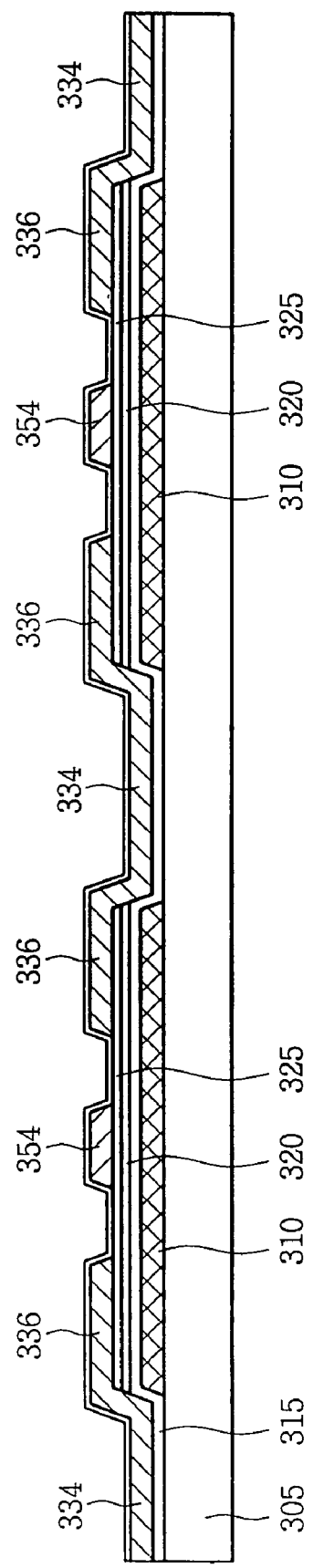
FIG. 7C is a cross-sectional view taken along the line E-E' of FIG. 6.

FIG. 7A is a cross-sectional view taken along the line C-C' of FIG. 6, FIG. 7B is a cross-sectional view taken along the line D-D' of FIG. 6 and FIG. 7C is a cross-sectional view taken along the line E-E' of FIG. 6.

Referring to FIGS. 7A to 7C, a metal layer including aluminum is deposited on a transparent substrate 305. The metal layer is patterned and a gate electrode 310 is formed. In FIGS. 7A to 7C, the gate electrode 310 includes only one layer. However, other metal, such as chrome (Cr) or molybdenum (Mo) may be deposited on the aluminum (Al), so that the gate electrode may have multi-layered structure.

Then, an insulation layer, such as silicon oxide or silicon nitride is deposited on the transparent substrate 305 on which the gate electrode 310 is formed. An intrinsic semiconductor material is deposited on the gate electrode 310 and an impurity semiconductor substance is deposited on the intrinsic semiconductor material.

Then, the insulation layer, the intrinsic semiconductor material and the impurity semiconductor material are etched away, so that a gate insulation layer 315, an intrinsic semiconductor layer 320 and an impurity insulation layer 325 are formed.

The gate insulation layer 315 covers an entire surface of the gate electrode 310. The intrinsic semiconductor layer 320 is formed on a region of the insulation layer 315 to be disposed over the gate electrode 310. The impurity insulation layer 325 is formed on the intrinsic semiconductor layer 320.

Then, metal, such as chrome (Cr) or alloy of chrome is deposited on the impurity semiconductor layer 225. The metal is patterned by a photolithography method to form a source electrode 350 and a drain electrode 330. A shape of the patterned source electrode 350 and of the patterned drain electrode 330 is as follows.

The drain electrode 330 includes a body drain electrode line (or a third body conductive region) 332, a hand drain electrode line (or a third hand conductive region) 334 and a finger drain electrode line (or a third finger conductive region) 336. The body drain electrode line 332 is formed near a circumference of the gate electrode 310 and is extended in a first direction.

The hand drain electrode line 334 includes a first hand drain electrode line 334a, a second hand drain electrode line 334b and a third hand drain electrode line 334c.

The first hand drain electrode line 334a is elongated from a first end of the body drain electrode line 332 in a second direction substantially perpendicular to the first direction, and the second hand drain electrode line 334b is elongated from a second end of the body drain electrode line 332 in the second direction, so that the body drain electrode line 332, the first hand drain electrode line 334a and the second hand drain electrode line 334b form an U-shape. The third hand drain electrode line 334c is extended in the second direction to be disposed between the first hand drain electrode line 334a and the second hand drain electrode line 334b.

The first hand drain electrode line 334a and the second hand drain electrode line 334b deviate from the gate electrode 310. The third hand drain electrode line 334c is disposed over the opening 111 of the gate electrode 310. Since the first hand drain electrode line 334a, the second hand drain electrode line 334b and the third hand drain electrode line 334c do not overlap the gate electrode 310, the area of the region where the drain electrode 330 overlaps the gate electrode 310 is minimized. Therefore, a parasitic capacitance between the gate electrode 310 and the drain electrode 330 is minimized.

The finger drain electrode line 336 is protruded from the first hand conductive region 334a, the second hand conductive region 334b and the third hand conductive region 334c. The finger drain electrode line 336 protruding from the first hand conductive region 334a is extended toward the third hand conductive region 334c to face the finger drain electrode line protruding from the third hand conductive region 334c. The finger drain electrode line 336 protruding from the second hand conductive region 334b is extended toward the third hand conductive region 334c to face the finger drain electrode line protruding from the third hand conductive region 334c.

The source electrode 350 includes a body source electrode line (or a second body conductive region) 352, a hand source electrode line (a second hand source electrode line) 354 and a finger source electrode line (a second finger conductive region) 356.

The body source electrode line 352 is disposed over the gate electrode 310 so that the body source electrode line 352 overlaps with the gate electrode 310. The body source electrode line 352 is extended in the first direction to face the body drain electrode 332. The hand source electrode line 354 protrudes from the body source electrode line 352 toward the body drain electrode line 332. The hand source electrode line 354 includes a first hand source electrode line 354a and a second hand source electrode line 354b. The first hand source electrode line 354a is disposed between the first hand drain electrode line 334a and the third hand drain electrode line 334c. The second hand source electrode line 354b is disposed between the third hand drain electrode line 334c and the second hand drain electrode line 334b. Therefore, each of the hand source electrode lines disposed between the hand drain electrode lines.

The finger source electrode line 356 is protruded from the first hand source electrode line 354a and the second hand source electrode line 354b. The finger source electrode line 356 is disposed between the finger drain electrodes 336. Therefore, each of the finger source electrodes 356 is disposed between the finger drain electrodes 336.

A portion of the impurity semiconductor layer 325 disposed between the drain electrode 330 and the source electrode 350 is eliminated clearly through etching.

A protection layer 345 is deposited on the entire surface of the transparent substrate 305 on which the source electrode 350 and the drain electrode 330 are formed. The protection layer 345 includes insulating materials such as silicon oxide and silicon nitride.

Figure 8:
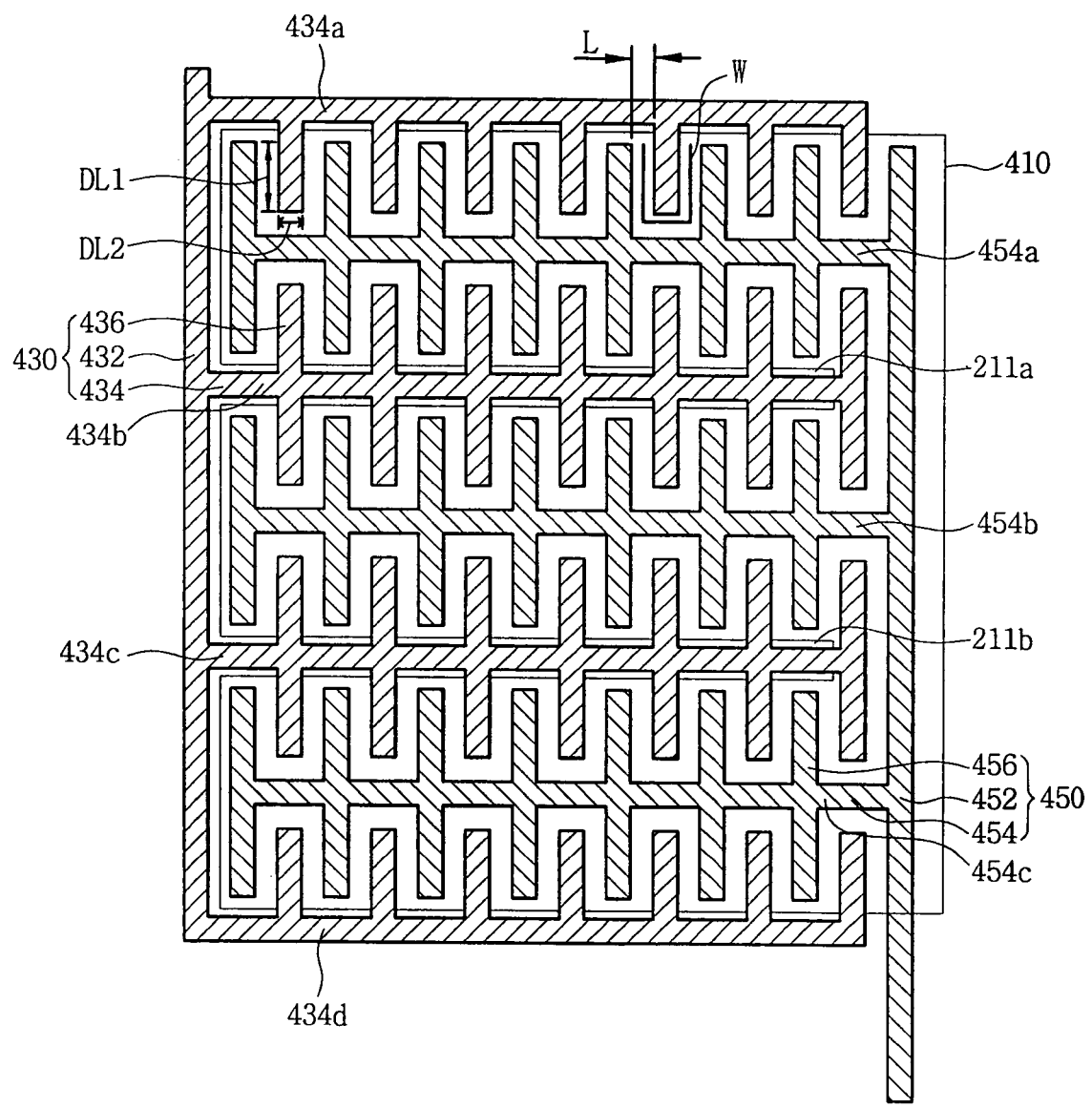
FIG. 8 is a layout showing an amorphous-silicon thin film transistor according to a third exemplary embodiment of the present invention.

FIG. 8 is a layout showing an amorphous-silicon thin film transistor according to a third exemplary embodiment of the present invention.

Referring to FIG. 8, the amorphous-silicon transistor of the third exemplary embodiment includes a gate electrode 410, a drain electrode 430 and a source electrode 450.

The gate electrode 410 is formed on a substrate (not shown). The gate electrode 410 having a rectangular shape has a first opening 211a and a second opening 211b.

The drain electrode 430 includes a body drain electrode line (or a third body conductive region) 432, a hand drain electrode line (or a third hand conductive region) 434 and a finger drain electrode line (or a third finger conductive region) 436. The body drain electrode line 432 is extended in a first direction and is formed at the circumference of the gate electrode 410.

The hand drain electrode line 434 includes a first hand drain electrode line 434a, a second hand drain electrode line 434b, a third hand drain electrode line 434c and a fourth hand drain electrode line 434d.

The first hand drain electrode line 434a is elongated from a first end of the body drain electrode line 432 in a second direction substantially perpendicular to the first direction, and the fourth hand drain electrode line 434d is elongated from a second end of the body drain electrode line 432 in the second direction, so that the body drain electrode line 432, the first hand drain electrode line 434a and the fourth hand drain electrode line 434d form an U-shape.

The second hand conductive region 434b and the third hand conductive region 424c protrude from the body conductive region 432 in the second direction. The second hand conductive region 434b and the third hand conductive region 434c are disposed between the first hand conductive region 434a and the fourth hand conductive region 434d.

The first hand drain electrode line 434a and the fourth hand drain electrode line 434d deviate from the gate electrode 410.

The second hand drain electrode line 434b is disposed over the first opening 211a of the gate electrode 410.

The third hand drain electrode line 434c is disposed over the second opening 211b.

Therefore, the first hand drain electrode line 434a, the second hand drain electrode line 434b, the third hand drain electrode line 434c and the fourth hand conductive region 434d do not overlap with the gate electrode 410, so that the area of the region where the drain electrode 430 overlaps with the gate electrode 410 is minimized. Therefore, a parasitic capacitance between the gate electrode 410 and the drain electrode 430 is minimized.

The finger drain electrode line 436 protrudes from the first hand conductive region 434a, the second hand conductive region 434b, the third hand conductive region 434c and the fourth hand conductive region 434d.

The finger drain electrode line 436 protruding from the first hand conductive region 434a is extended toward the second hand conductive region 434b to face the finger drain electrode line 436 protruding from the second hand conductive region 434b.

The finger drain electrode lines 436 protruding from the second hand conductive region 434b are extended toward the first and second hand conductive regions 434b and face the finger drain electrode lines 436 protruding from the first and third hand conductive region 434c.

The finger drain electrode lines 436 protruding from the third hand conductive region 434c is extended toward the second and fourth hand conductive regions 434b and face the finger drain electrode lines 436 protruding from the second and fourth hand conductive region 434d.

The source electrode 450 includes a body source electrode line (or a second body conductive region) 452, a hand source electrode line (or a second hand source electrode line) 454 and a finger source electrode line (or a second finger conductive region) 456.

The body source electrode line 452 is disposed over the gate electrode 410 so that the body source electrode line 452 overlaps the gate electrode 410.

The body source electrode line 452 is extended in the first direction and faces the body drain electrode 432.

The hand source electrode line 454 is protruded from the body source electrode line 452 toward the body drain electrode line 432. The hand source electrode line 454 includes a first hand source electrode line 454a, a second hand source electrode line 454b and a third hand source electrode line 454c.

The first hand source electrode line 454a is disposed between the first hand drain electrode line 434a and the second hand drain electrode line 434b. The second hand source electrode line 454b is disposed between the second hand drain electrode line 434b and the third hand drain electrode line 434c. The third hand source electrode line 454c is disposed between the third hand drain electrode line 434c and the fourth hand drain electrode line 434d. Therefore, each of the hand source electrode lines is disposed between the hand drain electrode lines.

The finger source electrode line 456 is protruded from the first hand source electrode line 454a, the second hand source electrode line 454b and the third hand source electrode line 454c. The finger source electrode line 456 is disposed between the finger drain electrodes 436. Therefore, each of the finger source electrode 456 is disposed between each of the finger drain electrodes 436.

Figure 9:
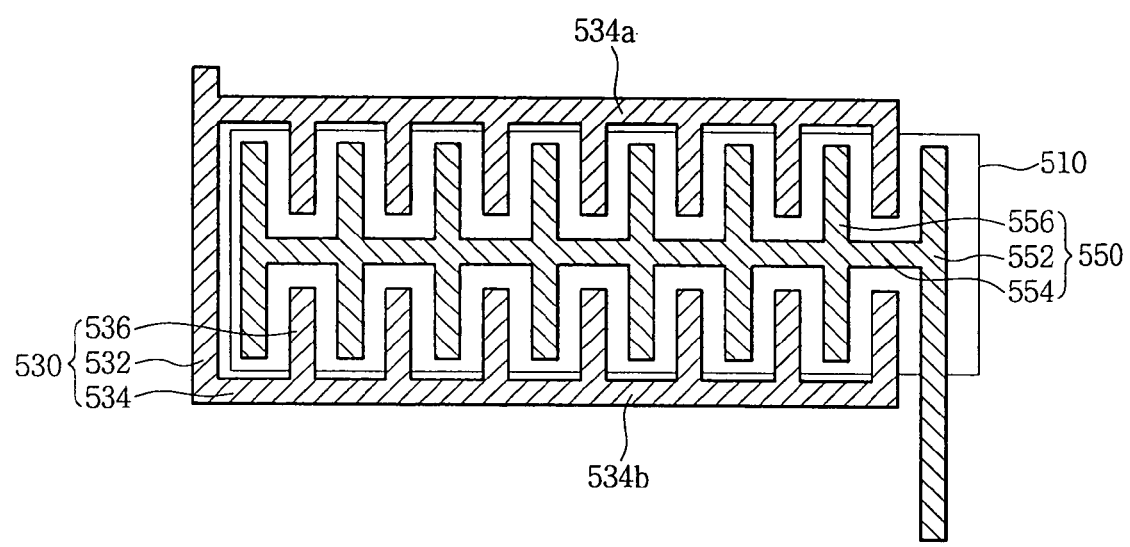
FIG. 9 is a layout showing an amorphous-silicon thin film transistor according to a fourth exemplary embodiment of the present invention.

FIG. 9 is a layout showing an amorphous-silicon thin film transistor according to a fourth exemplary embodiment of the present invention.

The gate electrode 510 is formed on a substrate (not shown). The gate electrode 510 has a rectangular shape.

The drain electrode 530 includes a body drain electrode line (or a third body conductive region) 532, a hand drain electrode line (or a third hand conductive region) 534 and a finger drain electrode line (or a third finger conductive region) 536.

The body drain electrode line 532 is extended in the first direction and is formed at the circumference of the gate electrode 510.

The hand drain electrode line 534 includes a first hand drain electrode line 534a and a second hand drain electrode line 534b.

The first hand drain electrode line 534a is elongated from a first end of the body drain electrode line 532, and the second hand drain electrode line 534b is elongated from a second end of the body drain electrode line 532, so that the body drain electrode line 532, the first hand drain electrode line 534a and the second hand drain electrode line 534b form an U-shape.

The first hand drain electrode line 534a and the second hand drain electrode line 534b deviate from the gate electrode 510.

Therefore, the first hand drain electrode line 534a and the second hand drain electrode line 534b do not overlap with the gate electrode 310, so that the area of the region where the drain electrode 530 overlaps the gate electrode 510 is minimized. Therefore, a parasitic capacitance between the gate electrode 510 and the drain electrode 530 is minimized.

The finger drain electrode line 536 is protruded from the first hand conductive region 534a and the second hand conductive region 534b.

The finger drain electrode line 536 protruding from the first hand conductive region 534a is extended toward the second hand conductive region 534b and faces the finger drain electrode line 536 protruding from the second hand conductive region 534b.

The source electrode 550 includes a body source electrode line (or a second body conductive region) 552, a hand source electrode line (or a second hand source electrode line) 554 and a finger source electrode line (or a second finger conductive region) 556.

The body source electrode line 552 is disposed over the gate electrode 510 so that the body source electrode line 552 overlaps with the gate electrode 510. The body source electrode line 552 is extended in the first direction and faces the body drain electrode 532. The hand source electrode line 554 protrudes from the body source electrode line 552 toward the body drain electrode 532.

The hand source electrode line 554 is disposed between the first hand drain electrode line 534a and the second hand drain electrode line 534b.

The finger source electrode line 556 is protruded from the hand source electrode line 554. Each of the finger source electrode line 556 is disposed between each of the finger drain electrodes 536. The amorphous-silicon thin film transistor according to the embodiment of the present invention is explained with reference to an inverted staggered type thin film transistor of which drain electrode and source electrode are disposed over the gate electrode.

However, the present invention may be applied to a staggered type thin film transistor of which drain electrode and source electrode are disposed under the gate electrode.

Only the amorphous-silicon transistor for reducing a parasitic capacitance between the gate and drain electrodes is disclosed, however, the amorphous-silicon transistor according to the present invention may also be employed in a shift register, a liquid crystal display panel or a liquid crystal display device adopting the shift register. The explanations about the shift register, the liquid crystal display panel and the liquid crystal display device employing the amorphous-silicon transistor according to the present invention is omitted.

As explained above, the amorphous-silicon thin film transistor includes the first conductive region, the second conductive region having a body conductive region and two hand conductive regions elongated from both ends of the body conductive region and the third conductive region having an elongated portion disposed between the two hand conductive regions of the second conductive region. The amorphous-silicon thin film transistor has a minimized channel length and a maximized channel width and has a reduced capacitance between the gate electrode and the drain electrode.

In a gate driver circuit including the amorphous-silicon thin film transistor, a pull-up transistor employing the above described amorphous-silicon thin film transistor has a reduced capacitance between the gate electrode and the drain electrode.

While the exemplary embodiments of the present invention and its advantages have been described in detail, it should be understood that various changes, substitutions and alterations can be made herein without departing from the spirit and scope of the invention as defined by appended claims.

What is claimed is:

1. A thin film transistor comprising:
a first conductive layer formed on a substrate;
a second conductive layer spaced apart from the substrate by a predetermined distance, the second conductive layer including a body conductive portion and two hand conductive portions elongated from both ends of the body conductive portion to form a symmetric U-shape; and
a third conductive layer spaced apart from the substrate by the predetermined distance, the third conductive layer including an elongated portion and a base portion substantially perpendicular to each other, the elongated portion straightly formed and disposed between the two hand conductive portions of the second conductive layer wherein contacts of the second and third conductive layers are on a same plane,
wherein the first conductive layer entirely overlaps the two hand conductive portions of the second conductive layer and the elongated portion of the third conductive layer.

2. The thin film transistor of claim 1, wherein the first conductive layer corresponds to a gate electrode, the second conductive layer corresponds to a source electrode, and the third conductive layer is a drain electrode.

3. The thin film transistor of claim 1, wherein a ratio of a selected length of the elongated portion to a width of the elongated portion is equal to or less than about 5, the selected length corresponding to a longitudinal length of a channel formed between the elongated portion and each hand conductive portion.

4. The thin film transistor of claim 1, wherein the second conductive layer further includes a protruding portion protruding from the body conductive portion to form a Y-shape.

5. The thin film transistor of claim 1, wherein the body conductive portion overlap the first conductive layer.

6. The thin film transistor of claim 1, the elongated portion is elongated from the base portion to form a T-shape.

7. The thin film transistor of claim 1, further comprising a semiconductor layer disposed between the first conductive layer and the second conductive layer, and between the first conductive layer and the third conductive layer, the semiconductor layer including the plane with which the second and third conductive layers make contact.

8. A thin film transistor comprising:
a first conductive layer corresponding to a first plane that is spaced apart from a substrate by a first distance;
a second conductive layer corresponding to a second plane that is spaced apart from the substrate by a second distance, the second conductive layer including a body conductive portion and two hand conductive portions elongated from both ends of the body conductive portion to form a symmetric U-shape; and
a third conductive layer corresponding to the second plane, the third conductive layer including an elongated portion and a base portion substantially perpendicular to each other, the elongated portion straightly formed and disposed between the two hand conductive portions of the second conductive layer,
wherein the second and third conductive layers are formed from a same layer, and
wherein the first conductive layer entirely overlaps the two hand conductive portions of the second conductive layer and the elongated portion of the third conductive layer.

9. The thin film transistor of claim 8, wherein the first conductive layer corresponds to a gate electrode, the second conductive layer corresponds to a source electrode, and the third conductive layer is a drain electrode.

10. The thin film transistor of claim 8, wherein a ratio of a selected length of the elongated portion to a width of the elongated portion is equal to or less than about 5, the selected length corresponding to a longitudinal length of a channel formed between the elongated portion and each hand conductive portion.

11. The thin film transistor of claim 8, wherein the second conductive layer further includes a protruding portion protruding from the body conductive portion to form a Y-shape.

12. The thin film transistor of claim 8, wherein the body conductive portion overlap the first conductive layer.

13. The thin film transistor of claim 8, wherein the third conductive layer further includes a base portion, and the elongated portion is elongated from the base portion to form a T-shape.

* * * * *